(12) United States Patent
Shimizu et al.

(10) Patent No.: US 10,020,162 B2
(45) Date of Patent: Jul. 10, 2018

(54) BEAM ALIGNMENT METHOD AND ELECTRON MICROSCOPE

(71) Applicant: JEOL Ltd., Tokyo (JP)

(72) Inventors: Yuko Shimizu, Tokyo (JP); Akira Yasuhara, Tokyo (JP); Kazuya Yamazaki, Tokyo (JP); Fumio Hosokawa, Tokyo (JP)

(73) Assignee: JEOL Ltd. (JP)

( * ) Notice: Subject to any disclaimer, the term of this patent is extended or adjusted under 35 U.S.C. 154(b) by 0 days.

(21) Appl. No.: 15/451,546

(22) Filed: Mar. 7, 2017

(65) Prior Publication Data

US 2017/0301507 A1    Oct. 19, 2017

(30) Foreign Application Priority Data

Mar. 8, 2016 (JP) .................... 2016-44563

(51) Int. Cl.

| G01N 23/00 | (2006.01) |
| H01J 37/147 | (2006.01) |
| H01J 37/28 | (2006.01) |
| H01J 37/20 | (2006.01) |
| H01J 37/22 | (2006.01) |
| H01J 37/26 | (2006.01) |

(52) U.S. Cl.
CPC ...... *H01J 37/1478* (2013.01); *H01J 37/1471* (2013.01); *H01J 37/20* (2013.01); *H01J 37/222* (2013.01); *H01J 37/265* (2013.01); *H01J 37/28* (2013.01); *H01J 2237/1506* (2013.01); *H01J 2237/221* (2013.01); *H01J 2237/223* (2013.01); *H01J 2237/2802* (2013.01)

(58) Field of Classification Search
None
See application file for complete search history.

(56) References Cited

U.S. PATENT DOCUMENTS

| 5,300,776 A * | 4/1994 | Krivanek ................ H01J 37/21 250/307 |
| 2007/0158567 A1* | 7/2007 | Nakamura .......... H01J 37/1471 250/311 |
| 2012/0119107 A1* | 5/2012 | Sawada ............... H01J 37/1471 250/396 ML |
| 2016/0020066 A1* | 1/2016 | Morishita ............ H01J 37/222 702/151 |

FOREIGN PATENT DOCUMENTS

JP          60167248 A      8/1985

* cited by examiner

*Primary Examiner* — Andrew Smyth
(74) *Attorney, Agent, or Firm* — The Webb Law Firm

(57) ABSTRACT

There is provided a beam alignment method capable of easily aligning an electron beam with a coma-free axis in an electron microscope. The method starts with tilting the electron beam (EB) in a first direction (+X) relative to a reference axis (A) and obtaining a first TEM (transmission electron microscope) image. Then, the beam is tilted in a second direction (−X) relative to the reference axis, the second direction (−X) being on the opposite side of the reference axis (A) from the first direction (+X), and a second TEM image is obtained. The reference axis is incrementally varied so as to reduce the brightness of the differential image between a power spectrum of the first TEM image and a power spectrum of the second TEM image.

5 Claims, 14 Drawing Sheets

BEAM ALIGNMENT METHOD AND ELECTRON MICROSCOPE

BACKGROUND OF THE INVENTION

Field of the Invention

The present invention relates to an electron beam alignment method and electron microscope.

Description of Related Art

In transmission electron microscopes (TEMs), a beam alignment is generally performed using a voltage axis alignment or current axis alignment technique (see, for example, JP-A-60-167248).

In recent years, transmission electron microscopes have tended to have higher resolution. With this trend, it is said that during high-resolution imaging, it is more important to align the direction of incidence of the electron beam with a coma-free axis than implementing any of the above-mentioned alignment techniques. On the coma-free axis, on-axis comatic aberration that is one of parasitic aberrations in an objective lens is null.

In this way, in a transmission electron microscope, it is important to align the incident direction of the electron beam with a coma-free axis. Accordingly, there is a need for a technique whereby a beam alignment with a coma-free axis is performed easily.

SUMMARY OF THE INVENTION

In view of the foregoing problem, the present invention has been made. One object associated with some aspects of the present invention is to provide a beam alignment method in which an alignment with a coma-free axis can be accomplished easily. Another object associated with some aspects of the invention is to provide an electron microscope in which a beam alignment with a coma-free axis can be accomplished easily.

(1) A beam alignment method associated with the present invention is for use to align the incident direction of an electron beam with a coma-free axis in an electron microscope. The method includes the steps of tilting the electron beam in a first direction relative to a reference axis and obtaining a first TEM image, tilting the electron beam in a second direction relative to the reference axis, the second direction being on the opposite side of the reference axis from the first direction, and obtaining a second TEM image, and modifying the reference axis in such a way as to reduce the brightness of a differential image between a power spectrum of the first TEM image and a power spectrum of the second TEM image.

In this beam alignment method, the incident direction of the electron beam can be aligned with the coma-free axis by modifying the reference axis (i.e., the incident direction of the electron beam) in such a way as to reduce the brightness of the differential image. Therefore, in this alignment method, the alignment can be performed easily.

(2) In one feature of this beam alignment method, the tilt angle of the electron beam relative to the reference axis when the first TEM image is obtained and the tilt angle of the electron beam relative to the reference axis when the second TEM image is obtained may be equal to each other in magnitude.

(3) An electron microscope associated with the present invention includes: a deflector for deflecting an electron beam to vary the direction of incidence of the electron beam relative to a sample; a deflector controller for performing a first operation, in which the deflector is controlled such that the electron beam is tilted in a first direction relative to a reference axis, and a second operation, in which the deflector is controlled such that the electron beam is tilted in a second direction relative to the reference axis, the second direction being on the opposite side of the reference axis from the first direction; a TEM image acquisition portion for obtaining a first TEM image and a second TEM image when the electron beam is tilted in the first direction and in the second direction, respectively; a differential image generator for generating a differential image between a power spectrum of the first TEM image and a power spectrum of the second TEM image; and a display controller for providing control to display the differential image on a display device.

In this electron microscope, the differential image between the power spectra of the first and second TEM images can be displayed on the display device. It is possible from this differential image to judge whether the direction of incidence of the electron beam is in alignment with the coma-free axis. Therefore, in this electron microscope, a beam alignment can be performed easily.

(4) In one feature of this electron microscope, the tilt angle of the electron beam relative to the reference axis assumed when the first TEM image is obtained and the tilt angle of the electron beam relative to the reference axis assumed when the second TEM image is obtained may be equal to each other in magnitude.

(5) In one feature of the electron microscope of (3) or (4) above, the deflector controller may repeatedly perform the first operation and the second operation.

In this electron microscope, the differential image can be displayed on the display device in real time. When the reference axis is varied, it is possible to immediately judge whether the direction of incidence of the electron beam corresponding to the reference axis is in alignment with the coma-free axis.

(6) In one feature of the electron microscope of any one of (3)-(5) above, there may be further included a notification portion for giving notice to a user that the alignment is complete when the brightness of the differential image drops to or below a threshold value.

In this electron microscope, it is easy to recognize whether the direction of incidence of the electron beam is in alignment with the coma-free axis.

(7) In one feature of the electron microscope of (3) or (4) above, there may be further included an incident direction determination portion for determining the direction of incidence of the electron microscope. The deflector controller may perform the first and second operations at each of incremental tilt angles of the reference axis while incrementally varying the tilt angle of the reference axis relative to the sample. The TEM image acquisition portion may obtain the first and second TEM images at each of the incremental tilt angles of the reference axis. The differential image generator may generate the differential image at each of the incremental tilt angles of the reference axis. The incident direction determining portion may determine the direction of incidence of the electron beam on the basis of the differential images generated at the incremental tilt angles of the reference axis.

In this electron microscope, the direction of incidence of the electron beam can be automatically aligned with the coma-free axis.

DESCRIPTION OF THE INVENTION

The preferred embodiments of the present invention are hereinafter described in detail with reference to the drawings. It is to be understood that the embodiments described below are not intended to unduly restrict the content of the present invention delineated by the appended claims and that not all the configurations described below are essential constituent components of the invention.

1. First Embodiment 1.1. Electron Microscope

Figure 1:
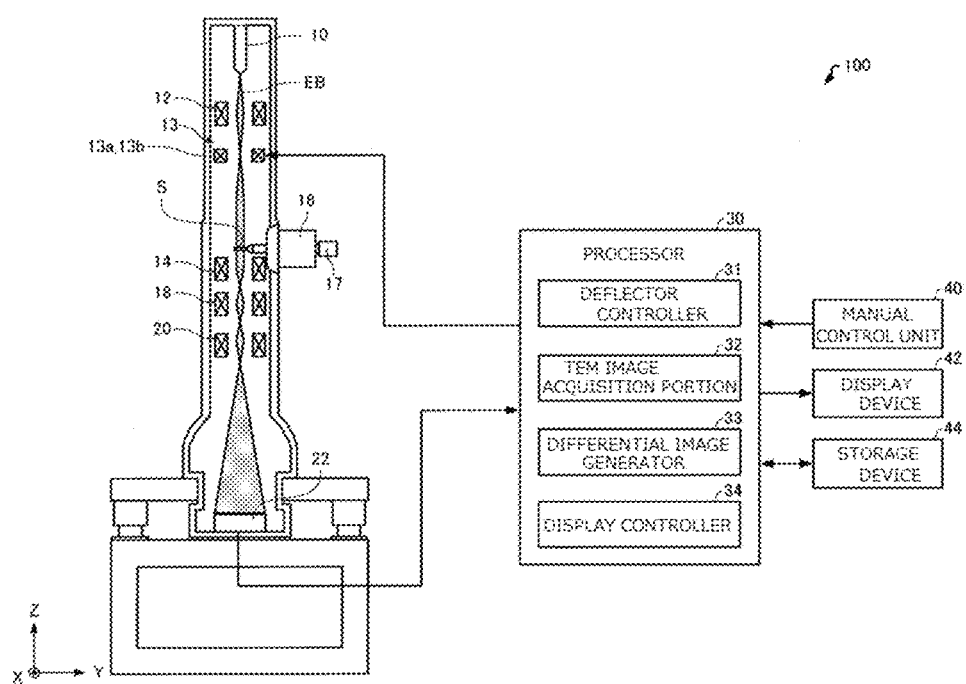
FIG. 1 is a schematic diagram, partly in block form, of an electron microscope associated with a first embodiment of the present invention.

An electron microscope associated with a first embodiment of the present invention is first described by referring to FIG. 1, which schematically shows the electron microscope, 100. In FIG. 1, X, Y, and Z axes are shown as three mutually perpendicular axes.

As shown in FIG. 1, the electron microscope 100 includes an electron source 10, a condenser lens system 12, an electron beam deflector 13 (one example of deflector), an objective lens 14, a sample stage 16, a sample holder 17, an intermediate lens 18, a projector lens 20, an imager 22, a processor 30, a manual control unit 40, a display device 42, and a storage device 44. The electron microscope 100 is a transmission electron microscope (TEM).

The electron source 10 generates an electron beam EB. For example, the electron source 10 is an electron gun that emits the electron beam by accelerating electrons, emitted from a cathode, by means of an anode. In the illustrated example, the electron beam EB emitted from the electron source 10 travels in the −Z direction.

The electron beam EB emitted from the electron source 10 is focused onto a sample S by the condenser lens system 12. The electron beam deflector 13 deflects the electron beam EB focused by the condenser lens system 12, so that the direction of incidence of the electron beam EB relative to the sample S can be varied. The beam deflector 13 is disposed, for example, between the condenser lens system 12 and the objective lens 14 or sample S.

The electron beam deflector 13 is configured including an X beam tilt coil 13a and a Y beam tilt coil 13b. The X beam tilt coil 13a can tilt the electron beam EB in the X direction. The Y beam tilt coil 13b can tilt the beam EB in the Y direction. The direction of incidence of the electron beam EB can be controlled in two dimensions and made to impinge on the sample S from various directions by the operation of the tilt coils 13a and 13b.

The electron beam deflector 13 varies the direction of incidence of the electron beam EB in response to a user's manipulation (e.g., a manipulation of the manual control unit 40 or a manipulative rotation of a deflector adjusting knob (not shown)). Consequently, the direction of incidence of the electron beam EB can be adjusted to a desired direction. Furthermore, as described later, the operation of the electron beam deflector 13 can be controlled by a deflector controller 31.

The objective lens 14 is an initial stage of lens for forming a transmission electron microscope (TEM) image from the electron beam EB transmitted through the sample S.

The sample stage 16 holds the sample S. In the illustrated example, the sample stage 16 holds the sample S via the sample holder 17. The sample stage 16 permits the sample S to be placed in position.

The intermediate lens 18 and projector lens 20 cooperate to further magnify the image focused by the objective lens 14 and to focus the further magnified image onto the imager 22. The objective lens 14, intermediate lens 18, and projector lens 20 together constitute the imaging system of the electron microscope 100.

The imager 22 captures the TEM image focused by the imaging system. For example, the imager 22 is a digital camera such as a CCD camera. The imager 22 provides an output indicative of image data about the captured TEM image to the processor 30.

The manual control unit 40 acquires a control signal responsive to a user's manipulative action and sends the signal to the processor 30. The function of the manual control unit 40 can be implemented, for example, by buttons, keys, a touch panel display, a microphone, or the like.

The display device 42 is operative to display the image generated by the processor 30. The function of the display device 42 can be realized by an LCD, a CRT, or the like.

The storage device 44 stores programs, data, and related information permitting the processor 30 to perform various calculational operations and control operations. The storage device 44 is also used as a working area for the processor 30.

Furthermore, the storage device 44 is used to temporarily store the results of calculations and other operations executed by the processor 30 in accordance with various programs. The functions of the storage device 44 can be implemented by a hard disk, a RAM, or the like.

The processor 30 controls the electron optical elements 12, 13, 14, 18, and 20 of the electron microscope 100 and provides control such that an image is displayed on the display device 42 to permit a user to perform an alignment of the direction of incidence of the electron beam EB with a coma-free axis (on which comatic aberration is minimum).

The functions of the processor 30 may be realized by causing various processors (such as a CPU and a DSP) to run programs. Alternatively, they may be realized by dedicated circuitry such as an ASIC (e.g., gate arrays). The processor 30 includes the aforementioned deflector controller 31, a TEM image acquisition portion 32, a differential image generator 33, and a display controller 34.

If the user issues an instruction to start an alignment of the direction of incidence with the coma-free axis in the X direction, the deflector controller 31 performs an operation to control the electron beam deflector 13 (X beam tilt coil 13*a*) so as to tilt the electron beam EB in the +X direction relative to a reference axis. Also, the deflector controller 31 performs an operation to control the electron beam deflector 13 so as to tilt the electron beam EB relative to the reference axis in the −X direction on the opposite side of the reference axis from the +X direction. At this time, the deflector controller 31 controls the X beam tilt coil 13*a* such that the tilt angle of the direction of incidence of the electron beam EB relative to the reference axis when the beam EB is tilted in the +X direction and the tilt angle of the direction of incidence relative to the reference axis when the beam EB is tilted in the −X direction are equal to each other in magnitude. The reference axis is an arbitrarily set axis and corresponds to the direction of incidence of the electron beam EB to be aligned with the coma-free axis.

The deflector controller 31 repeatedly performs the operation, in which the X beam tilt coil 13*a* is controlled to tilt the electron beam EB in the +X direction relative to the reference axis and the operation, in which the X beam tilt coil 13*a* is controlled to tilt the beam EB in the −X direction relative to the reference axis.

The TEM image acquisition portion 32 obtains the TEM image (+X) and the TEM image (−X) when the electron beam EB is tilted in the +X direction and −X direction, respectively, in such a way that the tilt angle of the electron beam EB relative to the reference axis when the TEM image (+X) is obtained and the tilt angle of the electron beam EB relative to the reference axis when the TEM image (−X) is obtained are equal to each other in magnitude.

The TEM image (+X) and the TEM image (−X) obtained by the TEM image acquisition portion 32 are amorphous images produced by capturing amorphous regions of the sample S.

The differential image generator 33 produces a differential image (X) between a power spectrum of the TEM image (+X) and a power spectrum of the TEM image (−X). For this purpose, the differential image generator 33 Fourier transforms the TEM images, for example, by a FFT (Fast Fourier Transform) technique. The differential image (X) is obtained by taking the difference between the power spectrum of the TEM image (+X) and the power spectrum of the TEM image (−X).

The display controller 34 provides control such that the differential image (X) generated by the differential image generator 33 is displayed on the display device 42.

If the user issues an instruction to start an alignment with the coma-free axis in the Y direction, the deflector controller 31 performs an operation to control the electron beam deflector 13 (Y beam tilt coil 13*b*) such that the electron beam EB is tilted in the +Y direction relative to the reference axis and an operation to control the electron beam deflector 13 such that the beam EB is tilted in the −Y direction on the opposite side of the reference axis from the +Y direction.

The TEM image acquisition portion 32 obtains a TEM image (+Y) arising when the electron beam EB is tilted in the +Y direction relative to the reference axis and a TEM image (−Y) arising when the beam EB is tilted in the −Y direction relative to the reference axis.

The differential image generator 33 generates a differential image (Y) between a power spectrum of the TEM image (+Y) and a power spectrum of the TEM image (−Y).

The display controller 34 provides control such that the differential image (Y) generated by the differential image generator 33 is presented on the display device 42.

Figure 2:
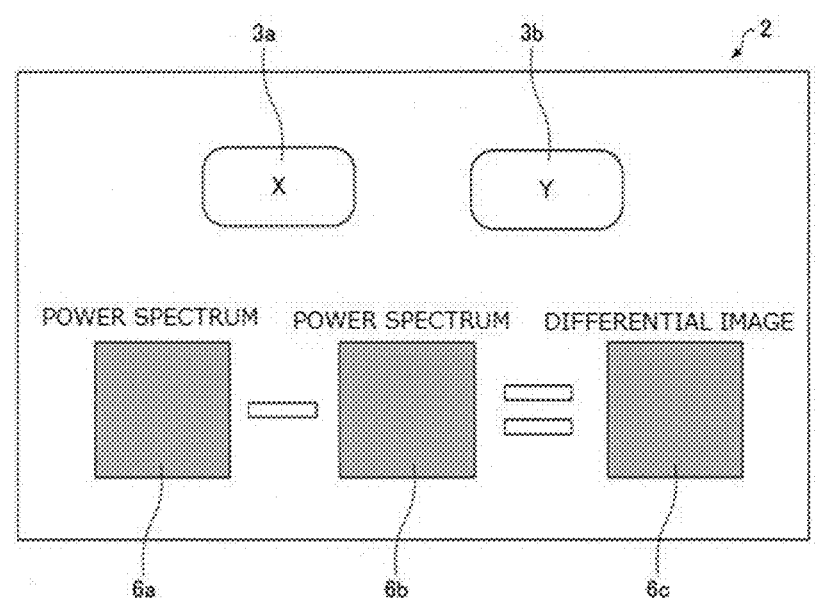
FIG. 2 is a schematic representation of the control screen of the electron microscope of FIG. 1.

FIG. 2 schematically shows the control screen 2 of the electron microscope 100. If an instruction for initiating an alignment of the direction of incidence with a coma-free axis is received via the manual control unit 40, the display controller 34 provides control to display the control screen 2 of FIG. 2 on the display device 42. The control screen 2 is composed including an X button 3*a*, a Y button 3*b*, a first power spectrum display region 6*a*, a second power spectrum display region 6*b*, and a differential image display region 6*c*.

The X button 3*a* is used to permit a user to start or end an alignment of the direction of incidence with the coma-free axis in the X direction. If an instruction for starting the alignment should be issued, the user depresses the X button 3*a*. If an instruction for ending the alignment should be issued, the X button 3*a* is again depressed.

The Y button 3*b* is used to permit a user to start or end an alignment of the direction of incidence with the coma-free axis in the Y direction. If an instruction for starting the alignment should be issued, the user depresses the Y button 3*b*. If an instruction for ending the alignment should be issued, the Y button 3*b* is again depressed.

A power spectrum of the TEM image (+X) or of the TEM image (+Y) is displayed on the first power spectrum display region 6*a*. A power spectrum either of the TEM image (−X) or of the TEM image (−Y) is displayed on the second power spectrum display region 6*b*.

The differential image (X) or differential image (Y) generated by the differential image generator 33 is displayed on the differential image display region 6*c*.

1.2. Operation of the Electron Microscope

Figure 3:
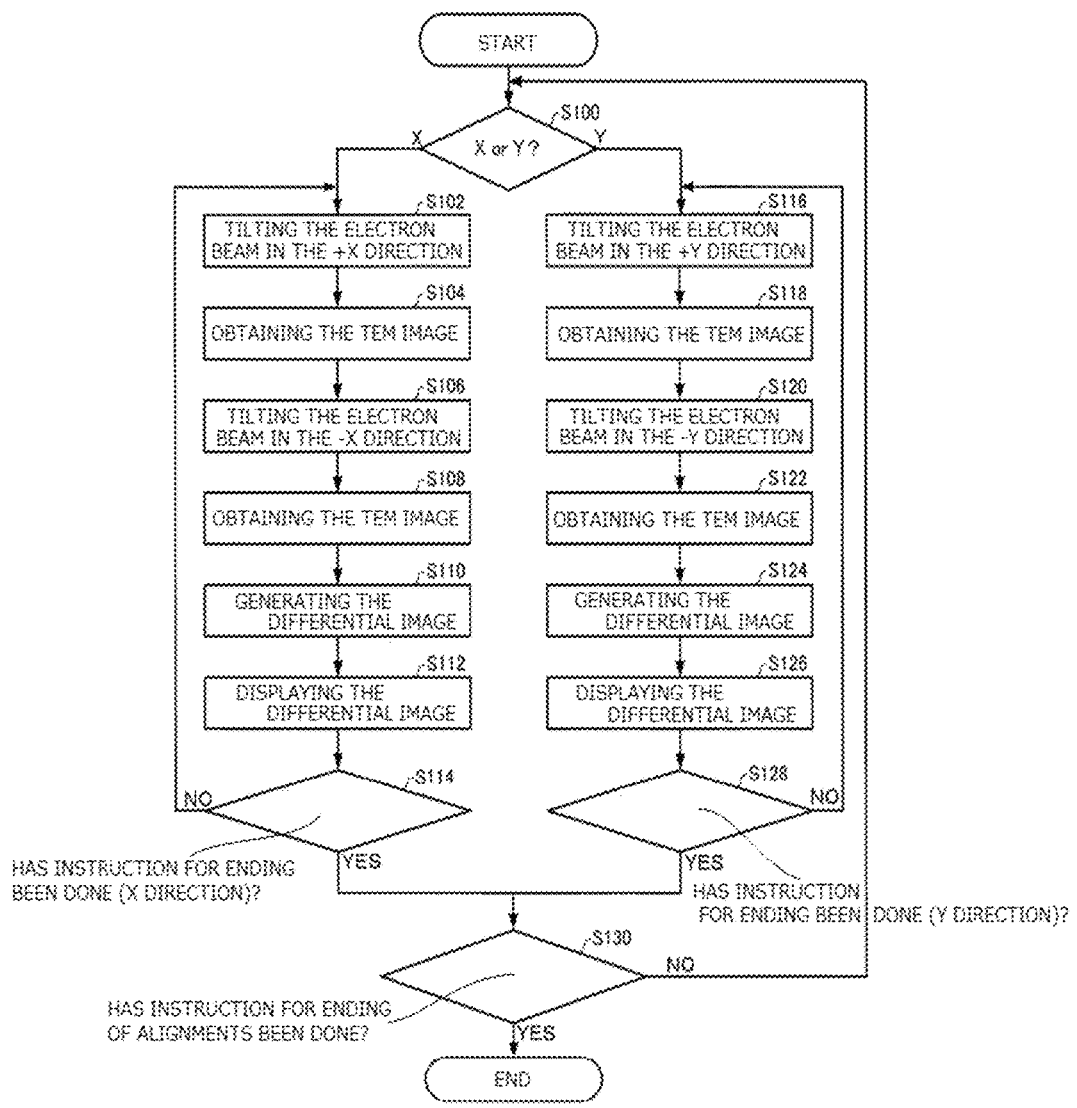
FIG. 3 is a flowchart illustrating one example of a sequence of operations performed by the electron microscope of FIG. 1.
Figure 4:
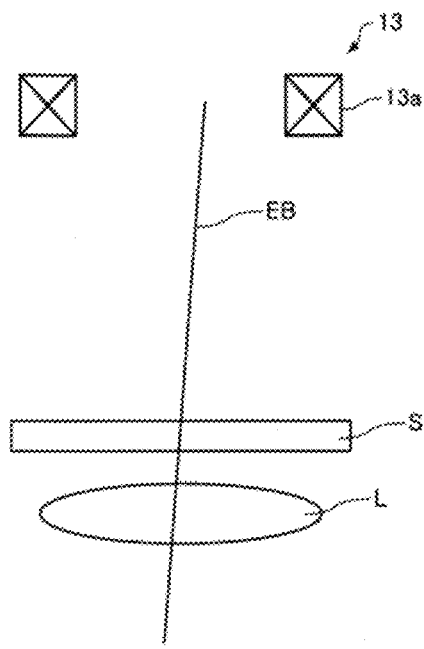
FIG. 4 is a schematic representation showing a state of the electron beam prior to a beam alignment with a coma-free axis.

The operation of the electron microscope 100 is next described. FIG. 3 is a flowchart illustrating one example of a sequence of operations performed by the electron microscope 100. FIG. 4 schematically shows the initial state of the electron beam EB impinging on a lens L (objective lens 14), as well as the sample S prior to the alignment (described later) of the direction of incidence with the coma-free axis.

The deflector controller 31 makes a decision as to whether or not the user has issued either an instruction for starting an alignment with the coma-free axis in the X direction or an instruction for starting an alignment with the coma-free axis in the Y direction (step S100).

If the X button 3*a* of the control screen 2 is depressed, the deflector controller 31 determines that the user has issued an instruction for starting an alignment of the direction of incidence with the coma-free axis in the X direction. If the Y button 3*b* of the control screen 2 is depressed, the deflector controller 31 determines that the user has issued an instruction for starting an alignment with the coma-free axis in the Y direction.

First, the user performs the alignment with the coma-free axis in the X direction. For this purpose, the user depresses the X button 3a to give an instruction to the deflector controller 31 to start the alignment with the coma-free axis in the X direction.

If the decision at step S100 is X, indicating that the deflector controller 31 has determined that the user has issued an instruction for starting the alignment with the coma-free axis in the X direction, the controller 31 controls the X beam tilt coil 13a to tilt the electron beam EB in the +X direction relative to the reference axis A (step S102).

Figure 5:
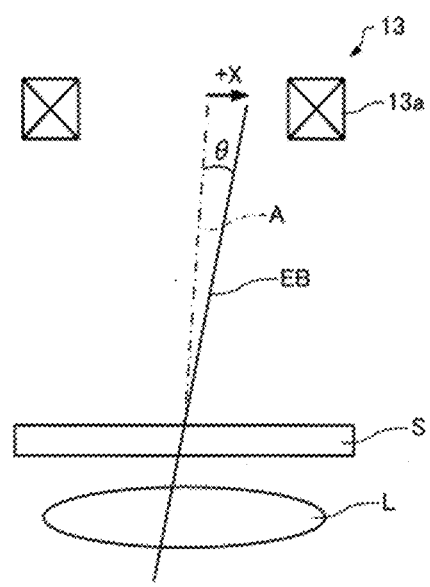
FIG. 5 is a schematic representation showing a state in which the electron beam is tilted in the +X direction relative to a reference axis by an X beam tilt coil.

FIG. 5 schematically shows a state in which the electron beam EB has been tilted in the +X direction relative to the reference axis A by the X beam tilt coil 13a. As shown in FIG. 5, the electron beam EB is tilted through angle θ in the +X direction relative to the reference axis A by the X beam tilt coil 13a. The reference axis A is coincident with the direction of incidence of the electron beam EB under the initial state shown in FIG. 4.

Then, the TEM image acquisition portion 32 obtains the TEM image (+X) when the electron beam EB is tilted in the +X direction relative to the reference axis A (step S104). The TEM image acquisition portion 32 controls the imager 22 such that the TEM image is captured at the timing at which the electron beam EB is tilted through the angle θ in the +X direction by the X beam tilt coil 13a. Consequently, the TEM image (+X) can be obtained.

Then, the deflector controller 31 controls the X beam tilt coil 13a to tilt the electron beam EB in the −X direction relative to the reference axis A (step S106).

Figure 6:
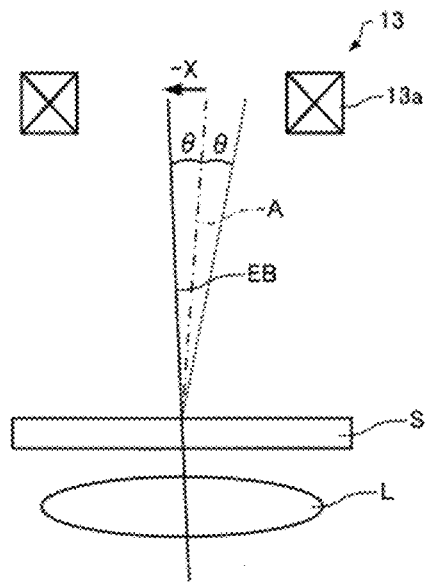
FIG. 6 is a schematic representation showing a state in which the electron beam is tilted in the −X direction relative to the reference axis by the X beam tilt coil.

FIG. 6 schematically shows a state in which the electron beam EB has been tilted in the −X direction relative to the reference axis A by the X beam tilt coil 13a. As shown in FIG. 6, the electron beam EB is tilted through the angle θ in the −X direction relative to the reference axis A by the X beam tilt coil 13a.

The TEM image acquisition portion 32 then obtains the TEM image (−X) when the electron beam EB is tilted in the −X direction relative to the reference axis A (step S108). The TEM image acquisition portion 32 controls the imager 22 such that the TEM image is captured at the timing at which the electron beam EB is tilted through the angle θ in the −X direction by the X beam tilt coil 13a. As a result, the TEM image (−X) can be derived.

The differential image generator 33 then generates a differential image (X) between a power spectrum of the TEM image (+X) and a power spectrum of the TEM image (−X) (step S110).

The display controller 34 then provides control such that the differential image (X) generated by the differential image generator 33 is displayed on the display device 42 (step S112).

The display controller 34 displays a power spectrum of the TEM image (+X), a power spectrum of the TEM image (−X), and the differential image (X) on the first power spectrum display region 6a, second power spectrum display region 6b, and differential image display region 6c, respectively, of the control screen 2 shown in FIG. 2.

The deflector controller 31, TEM image acquisition portion 32, differential image generator 33, and display controller 34 repeat the processing sequence of the steps S102-S112 until the user issues an instruction for ending the alignment with the coma-free axis in the X direction. In consequence, the differential image (X) is displayed on the differential image display region 6c of the control screen 2 in real time.

Figure 7:
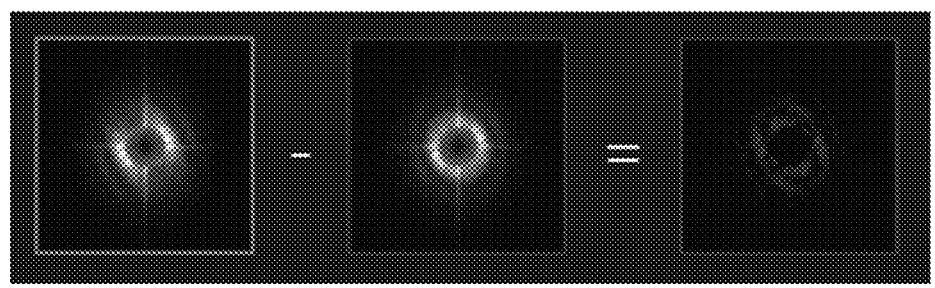
FIG. 7 illustrates one example of differential image between a power spectrum of a TEM image (+X) and a power spectrum of a TEM image (−X).
Figure 8:
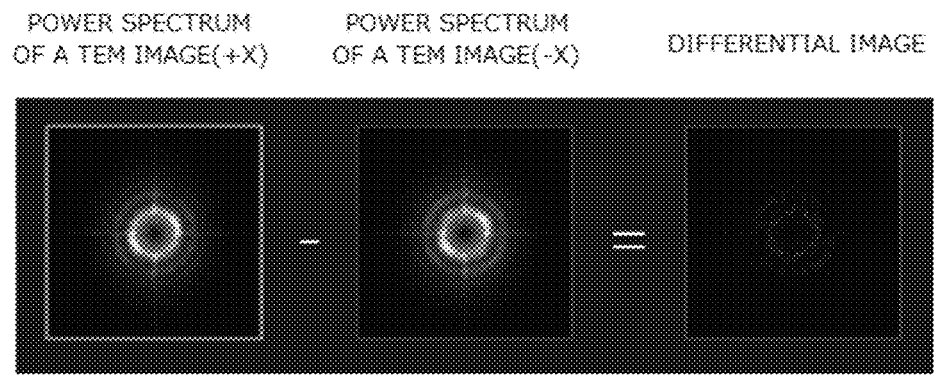
FIG. 8 illustrates another example of differential image between a power spectrum of a TEM image (+X) and a power spectrum of a TEM image (−X).

FIGS. 7 and 8 show examples of the differential image between a power spectrum of the TEM image (+X) and a power spectrum of the TEM image (−X). The differential image of FIG. 7 includes bright areas and has high brightness. That is, it can be said that the difference in power spectrum between the TEM image (+X) and the TEM image (−X) is great. This means that the direction of incidence of the electron beam EB along the reference axis A is not aligned with the coma-free axis.

On the other hand, the differential image of FIG. 8 contains no bright areas and has low brightness. That is, it can be said that the difference in power spectrum between the TEM image (+X) and the TEM image (−X) is small. This means that the direction of incidence of the electron beam EB along the reference axis A is in alignment with the coma-free axis.

The user manipulates the manual control unit 40 or the deflector control knob while noting the differential image (X) displayed in real time on the differential image display region 6c of the control screen 2 to reduce the brightness of the differential image (X). In response to the user's manipulation, the X beam tilt coil 13a modifies the direction of incidence of the electron beam EB (i.e., the reference axis A) by tilting the electron beam EB. If the brightness of the differential image (X) becomes sufficiently or minimally small as shown in FIG. 8, the user depresses the X button 3a of the control screen 2.

If the decision at step S114 is YES, indicating that the X button 3a of the control screen 2 has been depressed, the deflector controller 31 stops the operation for controlling the X beam tilt coil 13a.

Figure 9:
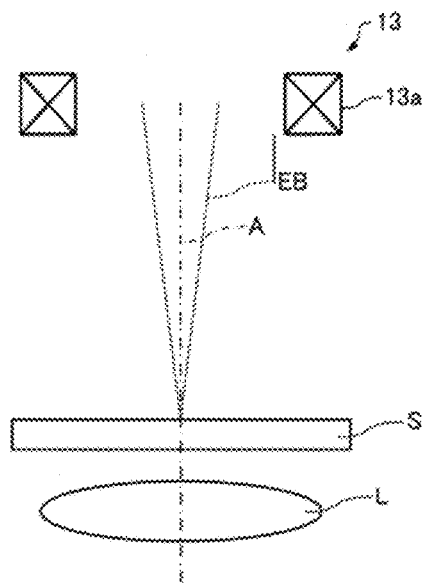
FIG. 9 is a schematic representation showing a state of the reference axis assumed when the brightness of the differential image (X) has decreased in the X direction.
Figure 10:
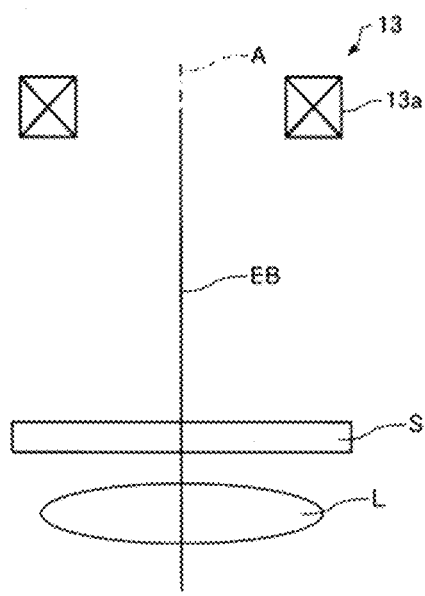
FIG. 10 is a schematic representation showing a state in which the direction of incidence of the electron beam has been brought into coincidence with the reference axis in the X direction.

FIG. 9 schematically shows a state of the reference axis A when the brightness of the differential image (X) has decreased sufficiently in the X direction. FIG. 10 schematically shows a state in which the direction of incidence of the electron beam EB has been aligned with the reference axis A of FIG. 9 in the X direction.

The direction of incidence can be aligned with the coma-free axis in the X direction by bringing the direction of incidence of the electron beam EB into coincidence with the reference axis A when the brightness of the differential image (X) has decreased sufficiently.

Then, the user performs an alignment of the direction of incidence with the coma-free axis in the Y direction. For this purpose, the user depresses the Y button 3b to issue an instruction for starting the alignment with the coma-free axis in the Y direction. At this time, as shown in FIG. 10, the state in which the direction of incidence of the electron beam EB in the X direction agrees with the coma-free axis is taken as the initial state. That is, the reference axis A is coincident with the direction of incidence of the electron beam EB under this initial condition.

The operation performed by the processor 30 for aligning the direction of incidence with the coma-free axis in the Y direction is similar to the alignment with the coma-free axis in the X direction except that the Y beam tilt coil 13b is operated. Further details will be described below.

If the decision at step S100 is YES, indicating that the deflector controller 31 has determined that the user has issued an instruction for starting an alignment with a coma-free axis in the Y direction, the controller 31 controls the Y beam tilt coil 13b to tilt the electron beam EB in the +Y direction relative to the reference axis A (step S116).

Then, the TEM image acquisition portion 32 obtains the TEM image (+Y) when the electron beam EB is tilted in the +Y direction relative to the reference axis A (step S118).

The deflector controller 31 then controls the Y beam tilt coil 13b to tilt the electron beam EB in the −Y direction relative to the reference axis A (step S120).

The TEM image acquisition portion 32 then obtains the TEM image (−Y) when the electron beam EB is tilted in the −Y direction relative to the reference axis A (step S122).

The differential image generator 33 then generates a differential image (Y) between a power spectrum of the TEM image (+Y) and a power spectrum of the TEM image (−Y) (step S124).

The display controller 34 then provides control such that the differential image (Y) generated by the differential image generator 33 is displayed on the display device 42 (step S126).

The display controller 34 displays a power spectrum of the TEM image (+Y), a power spectrum of the TEM image (−Y), and the differential image (Y) on the first power spectrum display region 6a, the second power spectrum display region 6b, and the differential image display region 6c, respectively, of the control screen 2 shown in FIG. 2.

The deflector controller 31, TEM image acquisition portion 32, differential image generator 33, and display controller 34 repeatedly perform the processing sequence of the step S116-S126 until the user issues an instruction for ending the alignment with the coma-free axis in the Y direction. As a consequence, the differential image (Y) is displayed on the differential image display region 6c of the control screen 2 in real time.

The user manipulates the manual control unit 40 or the deflector control knob to reduce the brightness of the differential image (Y) while noting the differential image (Y) displayed on the differential image display region 6c of the control screen 2 in real time. In response to the user's manipulation, the Y beam tilt coil 13b tilts the electron beam EB to modify the direction of incidence of the electron beam EB (i.e., the reference axis A). If the brightness of the differential image has decreased sufficiently, the user depresses the Y button 3b of the control screen 2.

If the decision at step S128 is YES, indicating that the Y button 3b of the control screen 2 has been depressed, the deflector controller 31 stops the operation for controlling the Y beam tilt coil 13b.

If the alignments with the coma-free axis in the X and Y directions are done, the user gives an instruction to the processor 30 via the manual control unit 40 to end the process of the alignments to the coma-free axis.

If the decision at step S130 is YES, indicating reception of the user's instruction for ending the process of alignments with the coma-free axis via the manual control unit 40, the processor 30 ends the processing sequence.

In the above example, the user performs an alignment to the coma-free axis in the Y direction after performing an alignment to the coma-free axis in the X direction. Alternatively, the user may perform an alignment to the coma-free axis in the X direction after performing an alignment to the coma-free axis in the Y direction. In addition, the user may carry out alignments to the coma-free axis alternately in the X and Y directions plural times.

The electron microscope 100 associated with the present embodiment has the following features. In the electron microscope 100, the differential image (X) can be displayed on the display device 42, the differential image (X) being between a power spectrum of the TEM image (+X) arising when the electron beam EB is tilted in the +X direction relative to the reference axis A and a power spectrum of the TEM image (−X) arising when the electron beam EB is tilted in the −X direction relative to the reference axis A. Similarly, in the electron microscope 100, the differential image (Y) between a power spectrum of the TEM image (+Y) and a power spectrum of the TEM image (−Y) can be displayed on the display device 42. A decision can be made from these differential images (X) and (Y) as to whether the direction of incidence of the electron beam EB is in alignment with the coma-free axis. Therefore, in the electron microscope 100, the process of the alignments to the coma-free axis can be performed readily.

In the electron microscope 100, the deflector controller 31 repeatedly performs the operation, in which the electron beam deflector 13 is controlled to tilt the electron beam EB in the +X or +Y direction relative to the reference axis A and the operation, in which the electron beam deflector 13 is controlled to tilt the electron beam EB in the −X or −Y direction relative to the reference axis A. Therefore, the differential image (X) or (Y) can be displayed on the display device 42 in real time. Hence, if the reference axis A is modified, it is possible to make an immediate decision as to whether the direction of incidence of the electron beam EB corresponding to the reference axis A is in alignment with the coma-free axis.

Furthermore, in the electron microscope 100, differential images can be used to confirm whether the present direction of incidence of the electron beam EB is in alignment with a coma-free axis. For example, in the case of an electron microscope loaded with software for automatically aligning the direction of incidence of the electron beam EB with a coma-free axis, the alignment may not be appropriately performed depending on operating conditions such as the magnification or contrast of the TEM images. Furthermore, in this electron microscope, the user cannot know whether an alignment process has been done appropriately. In contrast, in the inventive electron microscope 100, differential images can be displayed and so even if alignments are made automatically under software control, the user can easily judge whether the software-controlled alignment process has been done appropriately by checking the differential images.

An alignment method associated with the present embodiment includes the steps of tilting the electron beam EB in the +X direction relative to the reference axis A and obtaining a TEM image (+X), tilting the electron beam EB in the −X direction relative to the reference axis A and obtaining a TEM image (−X), modifying the reference axis A so as to reduce the brightness of the differential image (X) between a power spectrum of the TEM image (+X) and a power spectrum of the TEM image (−X). Furthermore, the alignment method associated with the present embodiment includes the steps of tilting the electron beam EB in the +Y direction relative to the reference axis A and obtaining a TEM image (+Y), tilting the electron beam EB in the −Y direction relative to the reference axis A and obtaining a TEM image (−Y), and modifying the reference axis A so as to reduce the brightness of the differential image (Y) between a power spectrum of the TEM image (+Y) and a power spectrum of the TEM image (−Y).

According to the alignment method associated with the present embodiment, the direction of incidence of the electron beam EB can be aligned with a coma-free axis by modifying the reference axis A (i.e., the direction of incidence of the electron beam EB) so as to reduce the brightness of the differential image. Therefore, according to the alignment method associated with the present embodiment, an alignment can be performed easily.

2. Second Embodiment
2.1. Electron Microscope

Figure 11:
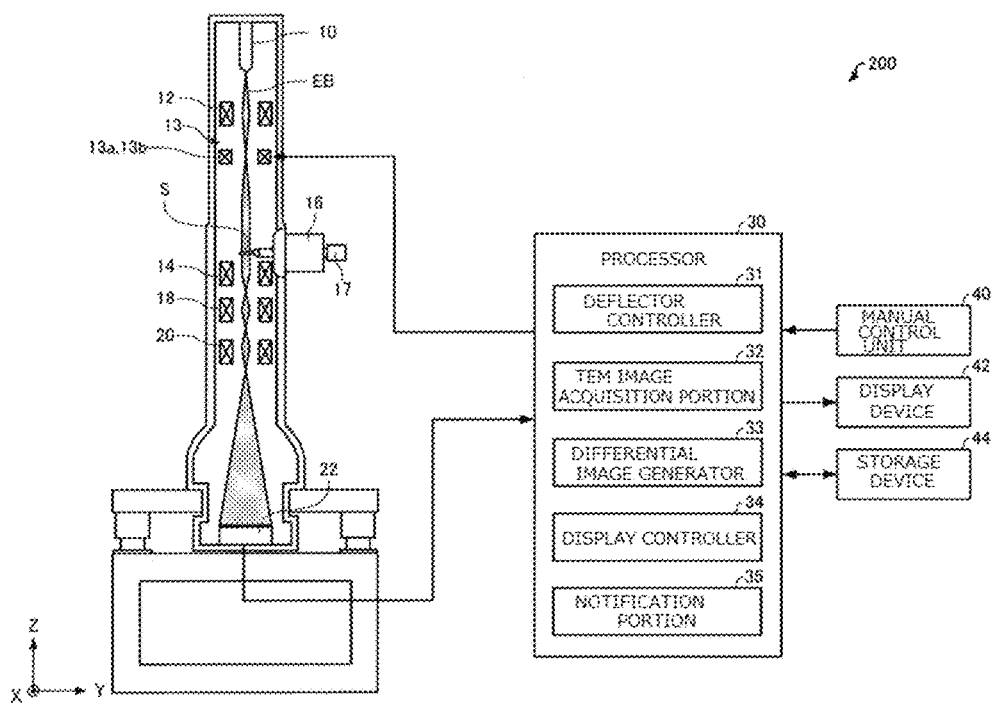
FIG. 11 is a schematic diagram, partly in block form, of an electron microscope associated with a second embodiment.

An electron microscope associated with a second embodiment is next described by referring to FIG. 11, which schematically shows this electron microscope, 200. Those members of the electron microscope 200 which are similar in function with their respective counterparts of the electron microscope 100 associated with the first embodiment are indicated by the same reference numerals as in the above referenced figures and a description thereof is omitted.

As shown in FIG. 11, the electron microscope 200 is different from the electron microscope 100 in that the processor 30 is configured including a notification portion 35.

If the brightness of a differential image is equal to or below a threshold value, the notification portion 35 informs the user that the alignment with the coma-free axis is complete. The brightness of the differential image may be the total brightness or average brightness of all pixels of the differential image. The threshold value is appropriately determined according to the required accuracy of the alignment or other factor.

Figure 12:
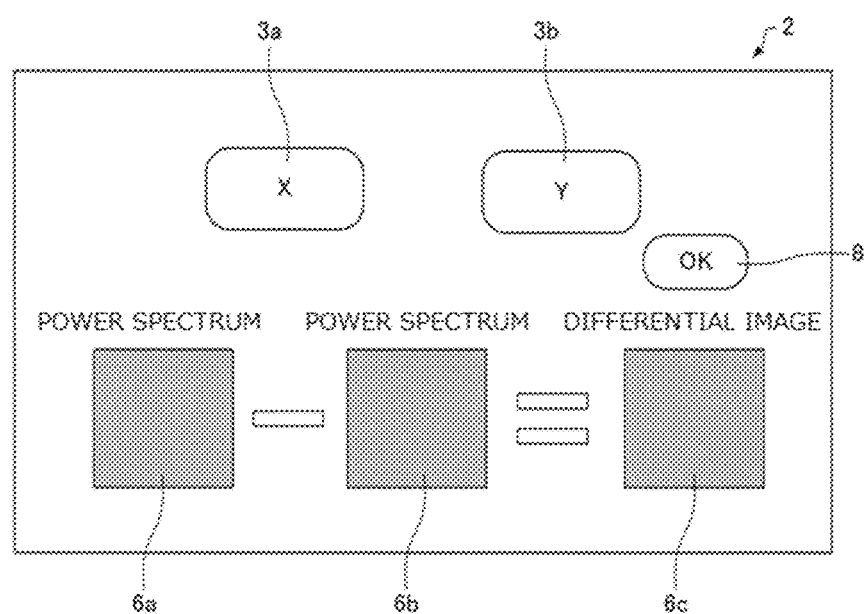
FIG. 12 is a schematic representation of the control screen of the electron microscope of FIG. 11.

FIG. 12 schematically shows the control screen 2 of the electron microscope 200. The notice from the notification portion 35 is given by displaying on the control screen 2 a notification message 8 providing notice of completion of an alignment with the coma-free axis as shown in FIG. 12. No restriction is imposed on the notice from the notification portion 35. For example, the notice may be an audible notice as produced from a buzzer or the like.

2.2. Operation of the Electron Microscope

Figure 13:
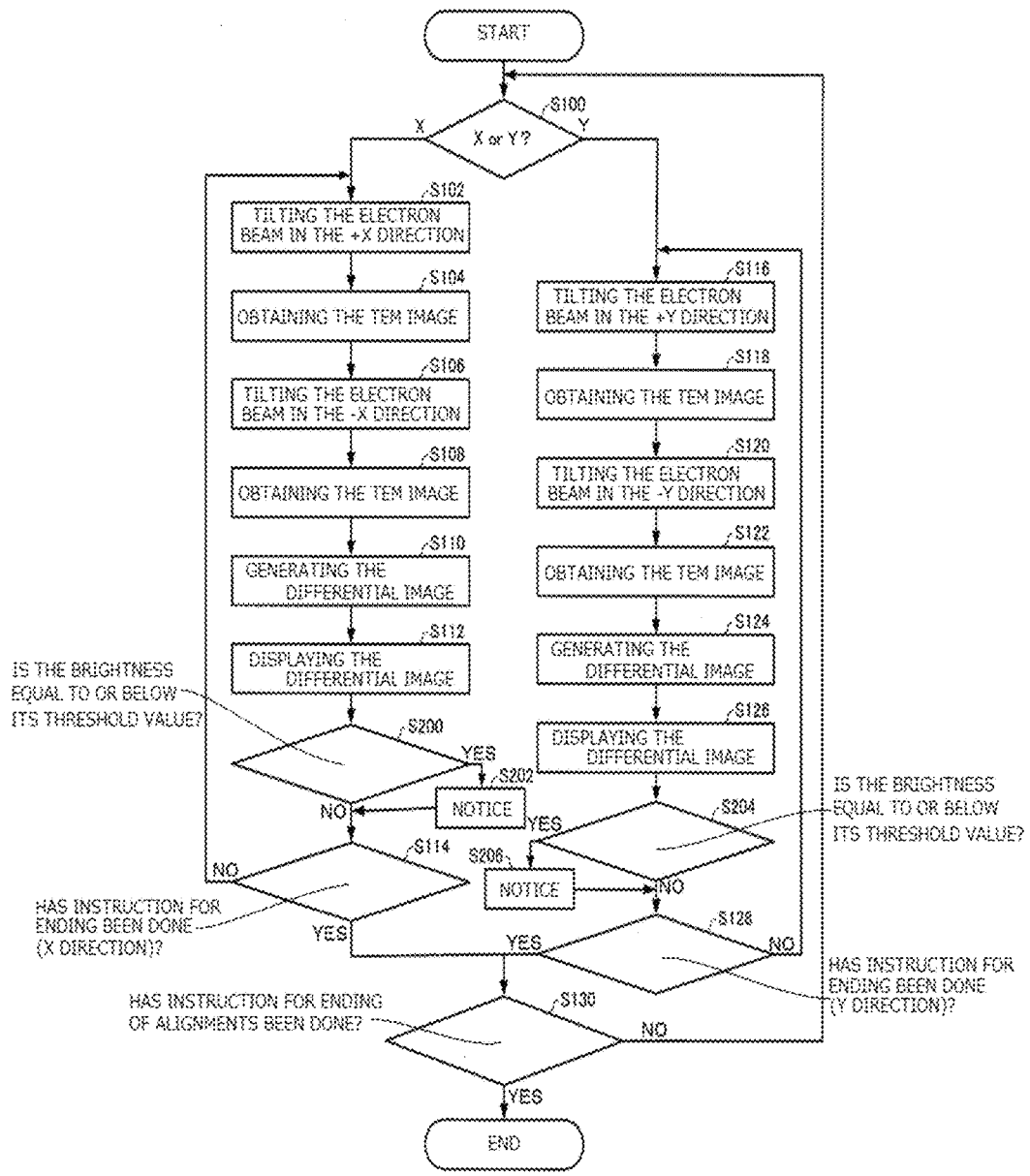
FIG. 13 is a flowchart illustrating one example of a sequence of operations performed by the electron microscope of FIG. 11.

The operation of the electron microscope 200 is next described. FIG. 13 is a flowchart illustrating one example of processing sequence of the electron microscope 200. Those steps of the flowchart of FIG. 13 which are operationally identical to their corresponding steps of the flowchart of FIG. 3 are indicated by the same reference numerals as in FIG. 3 and a description thereof is omitted below.

After the display controller 34 provides control to display the differential image (X) between a power spectrum of the TEM image (+X) and a power spectrum of the TEM image (−X) on the display device 42 (step S112), the notification portion 35 makes a decision as to whether the brightness of the differential image (X) is equal to or below its threshold value (step S200).

If the decision at step S200 is YES, indicating that the brightness of the differential image is equal to or below its threshold value, the notification portion 35 gives notice to the user that the alignment to the coma-free axis is complete (step S202). Then, step S114 is performed.

On the other hand, if the decision at step S200 is NO, indicating that the brightness of the differential image (X) is not equal to or below the threshold value, step S114 is performed.

After the display controller 34 provides control to display the differential image (Y) between a power spectrum of the TEM image (+Y) and a power spectrum of the TEM image (−Y) on the display device 42 (i.e., after step S126), the notification portion 35 makes a decision as to whether the brightness of the differential image (Y) is equal to or below the threshold value (step S204).

If the decision at step S204 is YES, indicating that the brightness of the differential image (Y) is equal to or below the threshold value, the notification portion 35 gives notice to the user that the alignment to the coma-free axis is complete (step S206). Then, step S128 is performed.

On the other hand, if the decision at step S204 is NO, indicating that the brightness of the differential image (Y) is not equal to or below the threshold value, step S128 is performed.

In the electron microscope 200 associated with the present embodiment, if the brightness of the differential image is equal to or below the threshold value, the notification portion 35 gives notice to the user that the alignment is complete and so the user can easily recognize whether the direction of incidence of the electron beam EB is in alignment with the coma-free axis.

3. Third Embodiment
3.1. Electron Microscope

Figure 14:
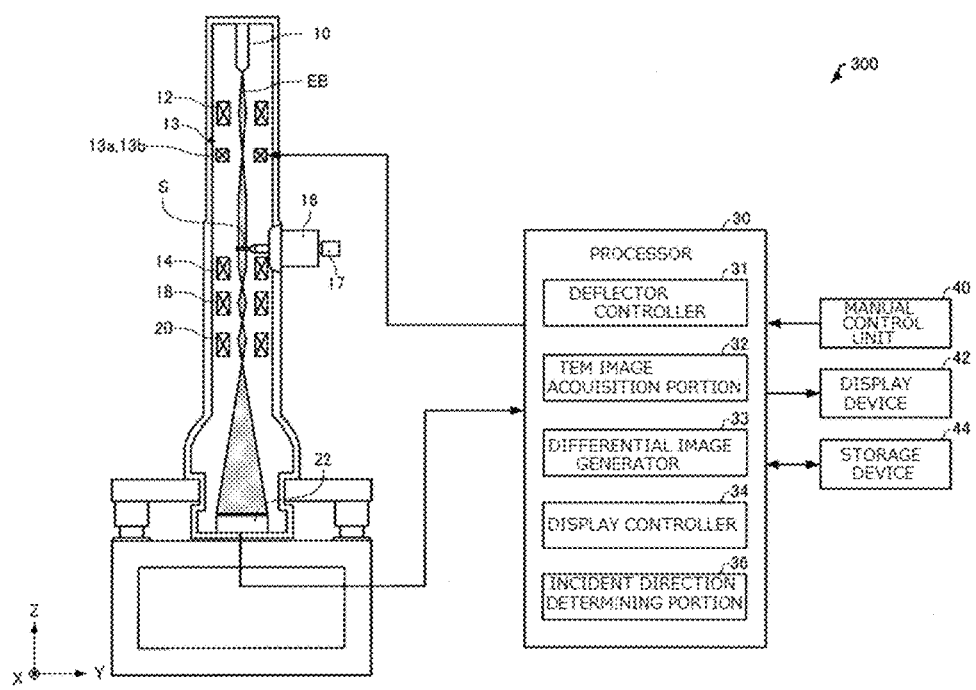
FIG. 14 is a schematic diagram, partly in block form, of an electron microscope associated with a third embodiment.

An electron microscope associated with a third embodiment is next described by referring to FIG. 14, which schematically shows this electron microscope, 300. Those members of the electron microscope 300 which are similar in function to their respective counterparts of the electron microscope 100 associated with the first embodiment are indicated by the same reference numerals as in the above referenced figures and a description thereof is omitted.

The electron microscope 300 is different from the electron microscope 100 in that the processor 30 is configured including an incident direction determining portion 36 as shown in FIG. 14. This incident direction determining portion 36 performs processing to determine the direction of incidence of the electron beam EB such that the direction of incidence of the beam EB agrees with a coma-free axis. That is, the electron microscope 300 can automatically perform an alignment with a coma-free axis.

In the electron microscope 300, the deflector controller 31 performs an operation, in which the electron beam EB is tilted in the +X direction relative to the reference axis A at each of incremental tilt angles of the reference axis A while incrementally varying the tilt angle of the reference axis A in the X direction relative to the sample S and an operation, in which the electron beam EB is tilted in the −X direction relative to the reference axis A.

Figure 15:
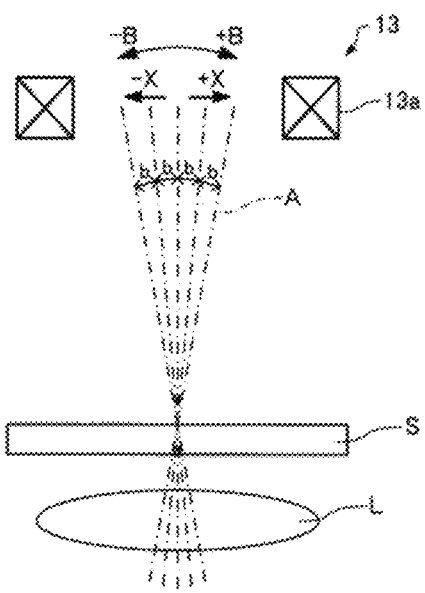
FIG. 15 is a schematic representation illustrating the manner in which the tilt angle of a reference axis is being varied stepwise.

FIG. 15 schematically shows the manner in which the tilt angle of the reference axis A (i.e., the direction of incidence of the electron beam EB) is being varied. The deflector controller 31 varies the tilt angle of the reference axis A relative to the sample S and the lens L by controlling the X beam tilt coil 13$a$ so as to vary the direction of incidence of the electron beam EB. In particular, the deflector controller 31 varies the tilt angle of the reference axis A by tilting the reference axis A in angular increments of b within a preset angular range from angle −B to angle +B.

The TEM image acquisition portion 32 obtains the TEM image (+X) and the TEM image (−X) at each of the incremental tilt angles of the reference axis A.

The differential image generator 33 generates a differential image (X) between a power spectrum of the TEM image (+X) and a power spectrum of the TEM image (−X) at each of the incremental tilt angles of the reference axis A.

The incident direction determining portion 36 determines the direction of incidence of the electron beam EB, based on the differential images generated at the incremental tilt angles of the reference axis A. Specifically, the incident direction determining portion 36 extracts the differential image (X) having the minimum brightness in terms of average brightness or total brightness of all the pixels from the differential images (X) generated at the incremental tilt angles of the reference axis A. The determining portion 36 takes the X-direction component of the tilt angle of the reference axis A at which the extracted differential image (X) is derived as the direction of incidence of the electron beam EB in the X direction. Consequently, an alignment to a coma-free axis in the X direction can be performed.

The deflector controller 31, TEM image acquisition portion 32, differential image generator 33, and incident direction determining portion 36 operate similarly for the Y direction and determine the direction of incidence of the electron beam EB for the Y direction. In consequence, an alignment to the coma-free axis in the Y direction can be performed.

Figure 16:
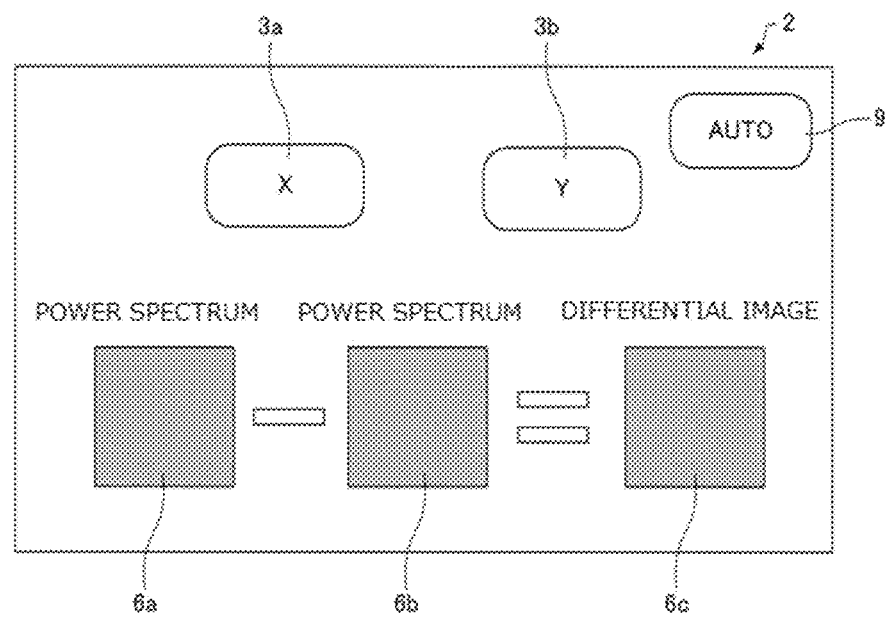
FIG. 16 is a schematic representation of the control screen of the electron microscope of FIG. 14.

FIG. 16 schematically shows the control screen 2 of the electron microscope 300. As shown in FIG. 16, the control screen 2 is configured including a button 9 permitting a user to issue an instruction for starting an automated alignment process.

3.2. Operation of the Electron Microscope

Figure 17:
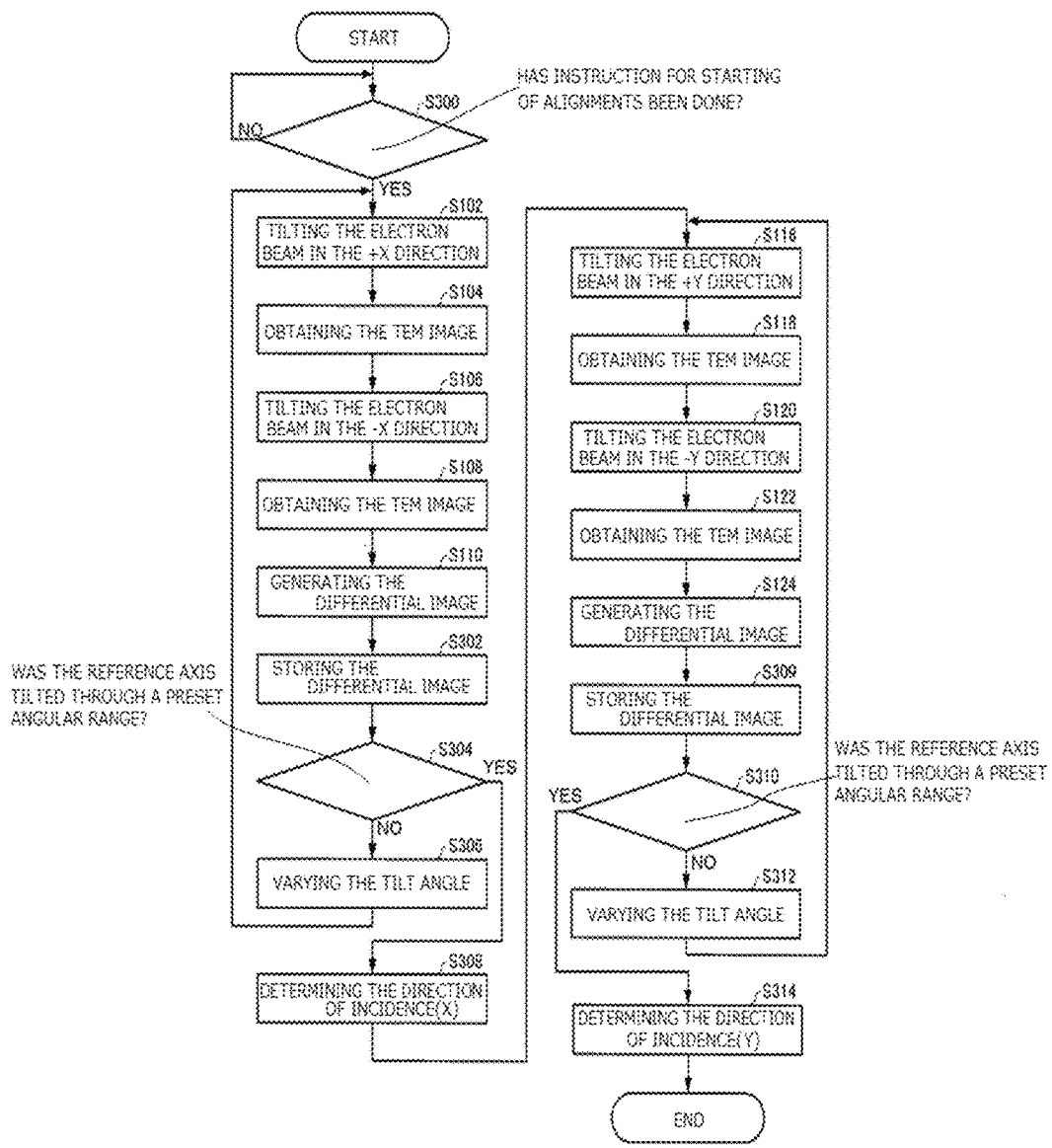
FIG. 17 is a flowchart illustrating one example of a sequence of operations performed by the electron microscope of FIG. 14.

The operation of the electron microscope 300 is next described. FIG. 17 is a flowchart illustrating one example of a processing sequence performed by the electron microscope 300. Those steps of the flowchart of FIG. 17 which are operationally identical to their corresponding steps of FIG. 3 are indicated by the same reference numerals as in FIG. 3.

The deflector controller 31 makes a decision as to whether the user has issued an instruction for starting an automated alignment (step S300). If the button 9 on the control screen 2 is depressed, the deflector controller 31 determines that the user has issued an instruction for starting an automated alignment.

If the decision at step S300 is YES, indicating that the user has issued an instruction for starting an automated alignment, the deflector controller 31 controls the X beam tilt coil 13a to tilt the electron beam EB in the +X direction relative to the reference axis A (step S102). It is herein assumed that the reference axis A is coincident with the direction of coincidence of the electron beam EB when the user has issued an instruction for starting an automated alignment.

Then, the TEM image acquisition portion 32 obtains the TEM image (+X) when the electron beam EB is tilted in the +X direction relative to the reference axis A (step S104).

The deflector controller 31 then controls the X beam tilt coil 13a to tilt the electron beam EB in the −X direction relative to the reference axis A (step S106).

The TEM image acquisition portion 32 then obtains the TEM image (−X) when the electron beam EB is tilted in the −X direction relative to the reference axis A (step S108).

The differential image generator 33 then generates the differential image (X) between a power spectrum of the TEM image (+X) and a power spectrum of the TEM image (−X) (step S110) and stores the generated differential image (X) into the storage device 44 together with information about the tilt angle of the reference axis A (step S302).

The deflector controller 31 then tilts the reference axis A by the preset angular increment b to vary the tilt angle (step S306). The deflector controller 31, TEM image acquisition portion 32, and differential image generator 33 perform the processing sequence of the steps S102-S306.

The processing sequence of the steps S102-S306 generates the differential image (X) at one incremental tilt angle of the reference axis A. The deflector controller 31, TEM image acquisition portion 32, and differential image generator 33 repeat this processing sequence of the steps S102-S306 while incrementally varying the tilt angle of the reference axis A to generate the differential images (X) at the incremental tilt angles of the reference axis A. If the decision at step S304 is YES, indicating that the reference axis A is tilted through a preset angular range from the angle −B to the angle +B, the incident direction determining portion 36 determines the direction of incidence of the electron beam EB on the basis of the differential images (X) generated at the incremental tilt angles of the reference axis A.

The incident direction determining portion 36 extracts the differential image (X) having the minimum brightness from the differential images (X) generated at the incremental tilt angles of the reference axis A and determines the X-direction component of the tilt angle of the reference axis A at which the extracted differential image (X) is derived as the direction of incidence of the electron beam EB in the X direction (step S308).

The deflector controller 31 then controls the Y beam tilt coil 13b to tilt the electron beam EB in the +Y direction relative to the reference axis A (step S116). It is herein assumed that the reference axis A is the tilt angle of the reference axis A at which the differential image (X) having the minimum brightness is extracted and derived in step S308.

The TEM image acquisition portion 32 then obtains the TEM image (+Y) when the electron beam EB is tilted in the +Y direction relative to the reference axis A (step S118).

The deflector controller 31 then controls the Y beam tilt coil 13b to tilt the electron beam EB in the −Y direction relative to the reference axis A (step S120).

The TEM image acquisition portion 32 then obtains the TEM image (−Y) when the electron beam EB is tilted in the −Y direction relative to the reference axis A (step S122).

The differential image generator 33 then generates a differential image (Y) between a power spectrum of the TEM image (+Y) and a power spectrum of the TEM image (−Y) (step S124) and stores the generated differential image (Y) into the storage device 44 together with information about the tilt angle of the reference axis A (step S309).

The deflector controller 31 then tilts the reference axis A in the preset angular increment to vary the tilt angle (step S312). The deflector controller 31, TEM image acquisition portion 32, and differential image generator 33 perform the processing sequence of the steps S116-S312.

The processing sequence of the steps S116-S312 generates a differential image (Y) at one incremental tilt angle. The deflector controller 31, TEM image acquisition portion 32, and differential image generator 33 repeat this processing sequence of the steps S116-S312 while incrementally varying the tilt angle of the reference axis A. As a result, differential images (Y) are generated at the incremental tilt angles. If the decision at step S310 is YES, indicating that the reference axis A is tilted through the preset angular range, the incident direction determining portion 36 determines the direction of incidence of the electron beam EB on the basis of the differential images (Y) generated at the incremental tilt angles of the reference axis A (step S314).

The incident direction determining portion 36 controls the electron beam deflector 13 such that the X-direction component of the direction of incidence of the electron beam EB is the direction found in step S308 and that the Y-direction component is the direction found in step S314. Because of the processing sequence, the direction of incidence of the electron beam EB can be aligned with the coma-free axis.

Since the electron microscope 300 associated with the present embodiment has the incident direction determining portion 36 for determining the direction of incidence of the electron beam EB, this direction of incidence can be automatically aligned with the coma-free axis.

In the above example, the processor 30 performs an alignment to a coma-free axis in the Y direction after making an alignment to the coma-free axis in the X direction.

Alternatively, an alignment to a coma-free axis in the X direction may be made after effecting an alignment to the coma-free axis in the Y direction. Furthermore, the processor 30 may align the electron beam with a coma-free axis in the X and Y directions alternately multiple times.

Furthermore, in the above example, the deflector controller 31 performs an alignment with a coma-free axis in the Y direction by tilting the reference axis A in the Y direction after performing an alignment with the coma-free axis in the X direction by tilting the reference axis A in the X direction. Alternatively, alignments with a coma-free axis may be made in the X and Y directions simultaneously by tilting the reference axis A in a two-dimensional manner.

Figure 18:
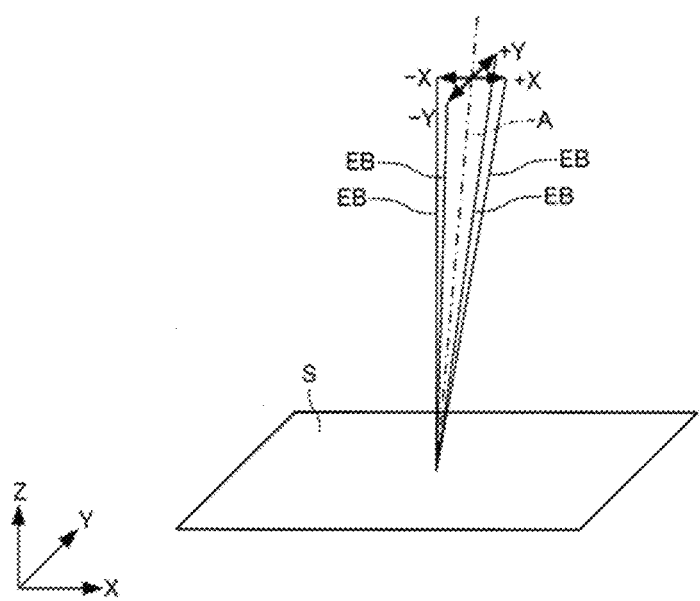
FIG. 18 is a diagram illustrating a modification of the sequence of operations performed by the electron microscope of FIG. 14.

Specifically, in this case, as shown in FIG. 18, the deflector controller 31 tilts the electron beam EB in four directions, i.e., +X direction, −X direction, +Y direction, and −Y direction, relative to one tilt angle of the reference axis A. The deflector controller 31 repeats this operation within a preset angular range while incrementally varying the tilt angle (elevation angle and azimuthal angle) of the reference axis A. The TEM image acquisition portion 32 obtains a TEM image (+X), a TEM image (−X), a TEM image (+Y), and a TEM image (−Y) for each incremental tilt angle of the reference axis A. The differential image generator 33 generates a differential image (X) and a differential image (Y) for each incremental tilt angle of the reference axis A. The incident direction determining portion 36 determines the direction of incidence of the electron beam EB on the basis of the differential images (X) and differential images (Y) generated for the incremental tilt angles of the reference axis A. Consequently, the direction of incidence of the electron beam EB can be automatically aligned with a coma-free axis in the same manner as in the above example.

It is to be noted that the above embodiments and modifications are merely exemplary and that the invention is not restricted thereto. For example, the embodiments and modifications may be combined appropriately.

The present invention embraces configurations substantially identical (e.g., in function, method, and results or in purpose and advantageous effects) with the configurations described in the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

Having thus described our invention with the detail and particularity required by the Patent Laws, what is desired protected by Letters Patent is set forth in the following claims.

The invention claimed is:

1. A beam alignment method of aligning the direction of incidence of an electron beam with a coma-free axis in an electron microscope, said method comprising the steps of:
tilting the electron beam in a first direction relative to a reference axis and obtaining a first TEM (transmission electron microscope) image;
tilting the electron beam in a second direction relative to the reference axis, the second direction being on the opposite side of the reference axis from the first direction, and obtaining a second TEM image; and
modifying the reference axis in such a way as to reduce a brightness of a differential image between a power spectrum of the first TEM image and a power spectrum of the second TEM image, wherein a tilt angle of said electron beam relative to said reference axis when said first TEM image is obtained and a tilt angle of said electron beam relative to the reference axis when said second TEM image is obtained are equal to each other in magnitude.

2. An electron microscope comprising:
a deflector for deflecting an electron beam to vary the direction of incidence of the electron beam relative to a sample;
a deflector controller for performing a first operation, in which the deflector is controlled such that the electron beam is tilted in a first direction relative to a reference axis, and a second operation, in which the deflector is controlled such that the electron beam is tilted in a second direction relative to the reference axis, the second direction being on the opposite side of the reference axis from the first direction;
a TEM image acquisition portion for obtaining a first TEM image and a second TEM image when the electron beam is tilted in the first direction and in the second direction, respectively;
a differential image generator for generating a differential image between a power spectrum of the first TEM image and a power spectrum of the second TEM image; and
a display controller for providing control to display the differential image on a display device, wherein a tilt angle of said electron beam relative to said reference axis when said first TEM image is obtained and a tilt angle of said electron beam relative to the reference axis when said second TEM image is obtained are equal to each other in magnitude.

3. The electron microscope as set forth in claim 2, wherein said deflector controller repeatedly performs said first operation and said second operation.

4. The electron microscope as set forth in claim 2, further comprising a notification portion for giving notice to a user that the alignment is complete when a brightness of said differential image drops to or below a threshold value.

5. The electron microscope as set forth in claim 2, further comprising an incident direction determining portion for determining the direction of incidence of said electron beam;
wherein said deflector controller performs said first operation and said second operation at each of incremental tilt angles of said reference axis while incrementally varying the tilt angle of the reference axis relative to the sample,
wherein said TEM image acquisition portion obtains said first TEM image and said second TEM image at each of the incremental tilt angles of the reference axis,
wherein said differential image generator generates said differential image at each of the incremental tilt angles of the reference axis, and
wherein said incident direction determining portion determines the direction of incidence of said electron beam on the basis of the differential images generated at the incremental tilt angles of the reference axis.

* * * * *